United States Patent
Okamura et al.

(10) Patent No.: US 8,524,422 B2
(45) Date of Patent: Sep. 3, 2013

(54) LOW EXPANSION GLASS SUBSTRATE FOR REFLECTION TYPE MASK AND METHOD FOR PROCESSING SAME

(75) Inventors: Kenji Okamura, Tokyo (JP); Masabumi Ito, Tokyo (JP); Hiroshi Kojima, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 11 days.

(21) Appl. No.: 13/163,338

(22) Filed: Jun. 17, 2011

(65) Prior Publication Data

US 2011/0244171 A1 Oct. 6, 2011

Related U.S. Application Data

(63) Continuation of application No. PCT/JP2009/070768, filed on Dec. 11, 2009.

(30) Foreign Application Priority Data

Dec. 17, 2008 (JP) ................. P2008-320876

(51) Int. Cl.
G03F 1/24 (2012.01)
G03F 1/22 (2012.01)

(52) U.S. Cl.
USPC ............................................................ 430/5

(58) Field of Classification Search
USPC .................. 430/5, 30; 378/35; 428/81, 428, 428/430

See application file for complete search history.

(56) References Cited

U.S. PATENT DOCUMENTS

| 6,951,502 B2 | 10/2005 | Koike et al. |
| 7,592,104 B2* | 9/2009 | Tanabe et al. ................ 430/5 |
| 2005/0186691 A1* | 8/2005 | Koike et al. .................. 438/14 |
| 2007/0009812 A1 | 1/2007 | Ito et al. |

FOREIGN PATENT DOCUMENTS

| JP | 2003-505891 A | 2/2003 |
| JP | 2005-316448 A | 11/2005 |
| JP | 2005-333124 A | 12/2005 |
| JP | 2008-257131 A | 10/2008 |
| JP | 2008-257132 A | 10/2008 |
| JP | 2008-292196 A | 12/2008 |
| WO | WO 01/07967 A1 | 2/2001 |

OTHER PUBLICATIONS

Extended European Search Report issued May 8, 2012 in Patent Application No. 09833389.1.
Roxann L. Engelstad et al., "Measuring and Characterizing the Nonflatness of EUVL Reticles and Electrostatic Chucks", Proceedings of SPIE, vol. 6730, XP-55024411, Jan. 1, 2007, pp. 673014-1-673014-11.
"Specification for Extreme Ultraviolet Lithography Mask Substrates", Semi Standard, vol. P37-1102, XP-009101509, Nov. 1, 2002, pp. 1-10.

(Continued)

Primary Examiner — Stephen Rosasco
(74) Attorney, Agent, or Firm — Oblon, Spivak, McClelland, Maier & Neustadt, L.L.P.

(57) ABSTRACT

The present invention relates to a low expansion glass substrate which serves as a substrate of a reflective mask used in a lithography step of semiconductor production steps, wherein two side surfaces positioned to face each other among side surfaces formed along a periphery of the low expansion glass substrate, each have a flatness of 25 μm or less.

20 Claims, 2 Drawing Sheets

(56) References Cited

OTHER PUBLICATIONS

M. Nataraju et al., "EUV Mask Substrate Flatness Definition and Measurement", EUVL Symposium, XP-55024811, Oct. 16-19, 2006, pp. 1-8.

International Search Report and Written Opinion issued on Mar. 9, 2010 in corresponding International Application No. PCT/JP2009/070768 filed on Dec. 11, 2009.

* cited by examiner

LOW EXPANSION GLASS SUBSTRATE FOR REFLECTION TYPE MASK AND METHOD FOR PROCESSING SAME

CROSS-REFERENCE TO RELATED APPLICATIONS

This application is a continuation of PCT Application No. PCT/JP2009/70768, filed Dec. 11, 2009, which is based upon and claims the benefit of priority from Japanese Patent Application No. 2008-320876 filed Dec. 17, 2008. The contents of both of these applications are incorporated herein by reference in their entirety.

TECHNICAL FIELD

The present invention relates to a low expansion glass substrate which is a substrate of a reflective mask used in a lithography step of semiconductor production steps, particularly, used in EUV (Extreme Ultra Violet) lithography; a method for processing the same; and a reflective mask provided with the glass substrate.

BACKGROUND ART

In the lithography technology, an exposure tool for producing an integrated circuit by transferring a fine circuit pattern onto a wafer has hitherto been widely utilized. With the trend toward a higher degree of integration and a higher performance of an integrated circuit, the refinement of the integrated circuit is advanced, the exposure tool is required to form a circuit pattern with high resolution onto the surface of a wafer at long focal depth, and shortening of the wavelength of an exposure light source is advanced.

The exposure light source is further advancing from conventional g-line (wavelength: 436 nm) and i-line (wavelength: 365 mm) and KrF excimer laser (wavelength: 248 nm), and ArF excimer layer (wavelength: 193 nm) is to be employed.

In the foregoing technology trend, a lithography technique using EUV light (extreme ultra violet light) as an exposure light source is attracting attention, as a lithography technology for producing a semiconductor device having a circuit size finer than 32 to 45 nm. The EUV light means light having a wavelength band of a soft X-ray region or a vacuum ultra-violet region, and specifically means light having a wavelength of from about 0.2 to 100 nm. At this time, use of 13.5 nm is considered as a lithography light source. The exposure principle of the EUV lithography (hereinafter referred to as "EUVL") is identical with that of the conventional lithography from the viewpoint that a mask pattern is transferred using a projection optical system. However, since there is no material capable of transmitting therethrough the light having the EUV light energy region, a refracting optical system cannot be used, and a reflecting optical system must be used (See Patent Document 1).

A reflective mask used in EUVL is basically configured with (1) a substrate, (2) a reflective multilayered film formed on the substrate, and (3) an absorber layer formed on the reflective multilayered film. For the reflective multilayered film, a film having a structure that plurality of materials each having different refractive index to a wavelength of exposure light are periodically laminated in nm order is used, and Mo and Si are known as the representative material. Furthermore, Ta and Cr are investigated for the absorber layer.

For the substrate, a material having a low coefficient of thermal expansion is required so as not to generate a strain even under EUV light irradiation, and a glass having a low coefficient of thermal expansion is investigated. In the present description, the glass having a low coefficient of thermal expansion is hereinafter collectively referred to as "low expansion glass" or "ultra-low expansion glass".

The substrate is produced by cutting those low expansion glass or ultra-low expansion glass material in a desired shape and size; and processing the surface on which the reflective multilayered film is to be formed of the substrate, that is, a main surface of the substrate, such that the surface has an extremely small flatness, specifically, the surface has the flatness of 50 nm or less. For this reason, when the flatness of the main surface of the substrate is measured, the measurement was required to conduct in very high precision with an error within ±10 nm.

On the other hand, regarding side surfaces of the substrate, Patent Document 2 proposes that any of side surfaces, chamfered portions and notched portions of the substrate is mirror polished to a surface roughness Ra of 0.05 µm or less for the purpose of the prevention of generating particles (fine glass pieces) from the side edge surface of the substrate. However, regarding the flatness of the side surface and chamfered portion of the substrate, it was considered that the processing of the ordinary level is sufficient.

PRIOR ART REFERENCE

Patent Document

Patent Document 1: JP-T-2003-505891
Patent Document 2: JP-A-2005-333124

SUMMARY OF THE INVENTION

Problems that the Invention is to Solve

However, the present inventors have found that in the case of a substrate for a reflective mask, which is required to measure a flatness of the main surface in high precision, surface properties of side surfaces and chamfered portions of the substrate, specifically flatnesses of side surfaces and chamfered portions, affect the measurement of the flatness of the main surface.

The present invention has been made in view of the above problems, and has an object to provide a low expansion glass substrate for a reflective mask, capable of measuring the flatness of the main surface in very high precision with an error within ±10 nm; a method for processing a glass substrate for obtaining the low expansion glass substrate for a reflective mask; and a reflective mask provided with the low expansion glass substrate for a reflective mask.

Means for Solving the Problems

In order to solve the above problems, the present invention provides a low expansion glass substrate which serves as a substrate of a reflective mask used in a lithography step of semiconductor production steps, wherein two side surfaces positioned to face each other among side surfaces formed along a periphery of the low expansion glass substrate, each have a flatness of 25 µm or less.

Further, the present invention provides a low expansion glass substrate which serves as a substrate of a reflective mask used in a lithography step of semiconductor production steps, wherein chamfered portions formed at corners between: two side surfaces positioned to face each other among side surfaces formed along a periphery of the low expansion glass substrate; and main surfaces of the low expansion glass substrate, each have a flatness of 25 μm or less.

Further, the present invention provides a low expansion glass substrate which serves as a substrate of a reflective mask used in a lithography step of semiconductor production steps, wherein two side surfaces positioned to face each other among side surfaces formed along a periphery of the low expansion glass substrate, and chamfered portions formed at corners between the two side surfaces and main surfaces of the low expansion glass substrate, each have a flatness of 25 μm or less.

In the low expansion glass substrate for a reflective mask according to the present invention, it is preferred that a parallelism of the two side surfaces is 0.01 mm/inch or less.

In the low expansion glass substrate for a reflective mask according to the present invention, it is preferred that squarenesses of the main surfaces of the low expansion glass substrate with the two side surfaces each are 0.01 mm/inch or less.

In the low expansion glass substrate for a reflective mask according to the present invention, wherein the low expansion glass substrate is a low expansion glass substrate having a coefficient of thermal expansion at 20° C. or 60° C. of 0±30 ppb/° C.

Further, the present invention provides a reflective mask provided with the low expansion glass substrate for a reflective mask according to the present invention.

Further, the present invention provides a method for processing a low expansion glass substrate which is a substrate serves as a reflective mask used in a lithography step of semiconductor production steps, the method comprising:

measuring flatnesses after pre-polishing, of two side surfaces positioned to face each other among side surfaces formed along a periphery of the low expansion glass substrate; and setting processing conditions of the two side surfaces in site by site, based on the flatnesses of the two side surfaces.

Advantage of the Invention

In the low expansion glass substrate for a reflective mask of the present invention, side surfaces or chamfered portions, which serve as holding portions of the low expansion glass substrate in measuring a flatness of the film-formed surface, have an excellent flatness. Therefore, deformation of the substrate held does not give influence to the measurement of a flatness of a main surface. Therefore, the flatness of a main surface can be measured in very high precision with an error within ±10 nm, and the main surface of the substrate can be processed into the surface having an excellent flatness, specifically the surface having the flatness of 50 nm or less.

According to the method for processing the low expansion glass substrate of the present invention, side surfaces of the low expansion glass substrate can be processed into the side surfaces having an excellent flatness. Therefore, the method is suitable to obtain the low expansion glass substrate for a reflective mask of the present invention.

MODE FOR CARRYING OUT THE INVENTION

In order to respond to a high degree of integration and a high fineness of an integrated circuit, it is preferred that the low expansion glass substrate of the present invention has a smaller coefficient of thermal expansion and smaller variation of a coefficient of thermal expansion. Specifically, the low expansion glass substrate having a coefficient of thermal expansion at 20° C. or 60° C. of 0±30 ppb/° C., and preferably 0±10 ppb/° C., and particularly the ultra-low expansion glass substrate having a coefficient of thermal expansion at 20° C. or 60° C. of 0±5 ppb/° C., is preferred. The low expansion glass substrate having a coefficient of thermal expansion in the above range can sufficiently respond to temperature change in semiconductor production steps and can facilitate a transfer of a high fineness circuit pattern. Examples of the base material of the low expansion glass substrate include low expansion glasses such as $TiO_2$-containing synthetic quartz glasses, ULE (registered trademark: Corning Code 7972) and ZERODUR (registered trademark, Schott AG). Of those, the $TiO_2$-containing synthetic quartz glass is excellent as an ultra-low expansion glass, and is suitable for use as a substrate of a reflective mask.

Figure 1:
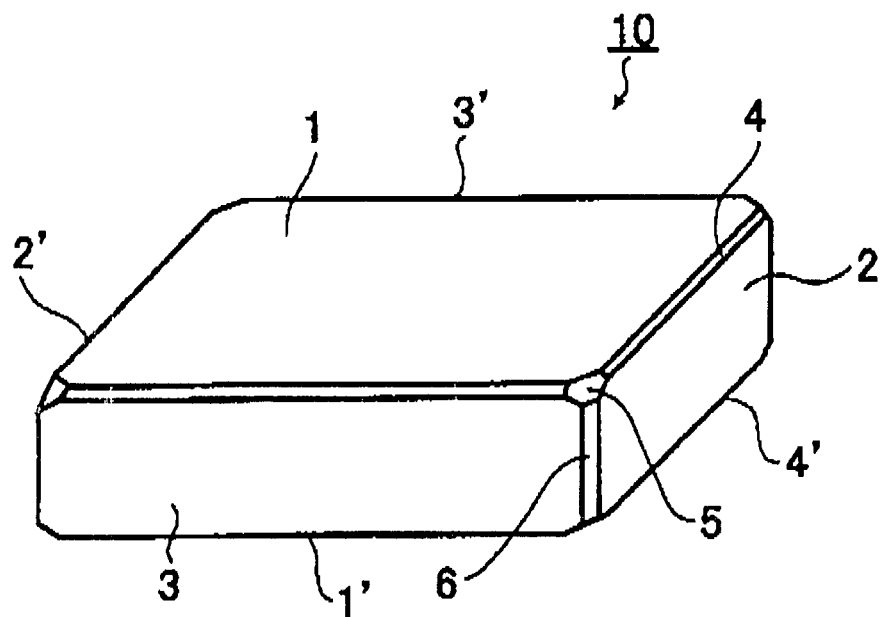
FIG. 1 is a perspective view of a low expansion glass substrate generally used for a reflective mask.

The present invention is described below by reference to the drawings. FIG. 1 is a perspective view of a low expansion glass substrate generally used for a reflective mask, and FIG. 2 is an enlarged cross-sectional view of an end of the low expansion glass substrate.

Figure 2:
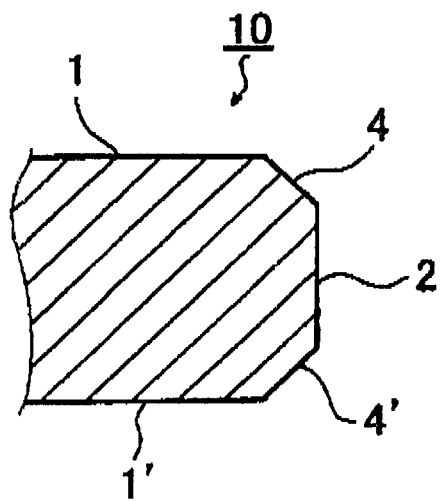
FIG. 2 is an enlarged cross-sectional view of an end of the low expansion glass substrate shown in FIG. 1.

As shown in FIGS. 1 and 2, a low expansion glass substrate 10 has a planar shape of a square or a rectangle, and has two main surfaces 1 and 1' positioned to face each other, and four side surfaces 2, 2', 3 and 3' formed along a periphery of the low expansion glass substrate 10. Chamfered portions 4 and 4' are formed by chamfering at corners between the main surfaces 1 and 1' and the side surfaces 2, 2', 3 and 3'. Further, in order to identify the front and back sides of the low expansion glass substrate 10, notched portion 5 and chamfered portion 6 are generally formed by chamfering.

In the first embodiment of the low expansion glass substrate for a reflective mask of the present invention (hereinafter referred to as a "first low expansion glass substrate"), two side surfaces positioned to face each other among four side surfaces 2, 2', 3 and 3', each have a flatness of 25 μm or less. In the case of the low expansion glass substrate 10 shown in FIG. 1, flatnesses of the side surfaces 2 and 2', or the side surfaces 3 and 3', each are 25 μm or less.

That "the side surfaces 2 and 2' each have a flatness of 25 μm or less" means that the flatness in the entire side surface is 25 μm or less in the respective side surfaces 2 and 2', that is, the difference in height in each entire side surfaces is 25 μm or less (the same is applied to the case that flatnesses of side surfaces 3 and 3' each are 25 μm or less).

The flatness of the side surface can be measured using a flatness measuring equipment, for example, FM200, manufactured by Corning Tropel.

In the first low expansion glass substrate, the reason that the flatnesses of two side surfaces positioned to face each other, each are made to be 25 μm or less is as follows.

Figure 3:
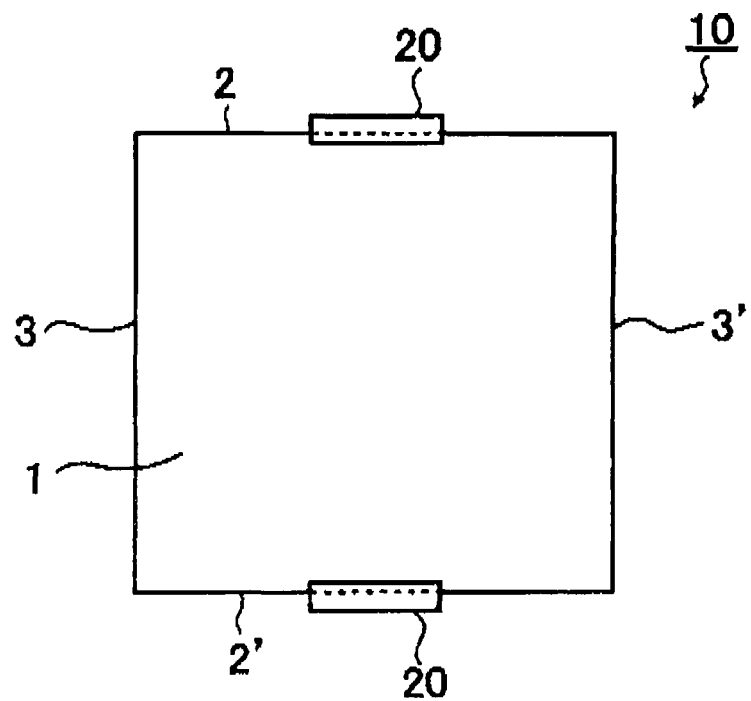
FIG. 3 is a schematic view showing a holding state of a substrate in measuring a flatness of the main surface.

The measurement of a flatness of a main surface of a substrate is generally carried out, for example, with holding the side surfaces (surfaces to be held) 2 and 2' of the substrate 10 by a holder 20 in the state that the main surface 1 is upright, as shown in FIG. 3. In this state, the substrate 10 is deformed by its own weight and a holding force applied to the side surfaces 2 and 2'. In such a case, the deformation amount is extremely small, and, considering the entire substrate, the deformation is equivalent. Therefore, it was considered that the deformation does not affect the measurement of a flatness of a main surface.

However, the present inventors have found that because the flatness of a main surface is required to be measured with high precision in a low expansion glass substrate used in a reflective mask for EUVL, surface properties of side surfaces, specifically, flatnesses of side surfaces that were not conventionally considered to be a problem affect the measurement of a flatness of a main surface. That is, when the flatness of at least one of the side surfaces 2 and 2' that serve as surfaces to be held is large, in holding the side surfaces of the substrate in the state that the main surface is upright, local deformation is generated in the substrate and affects the measurement of the flatness of the main surface.

When the flatnesses of the side surfaces (surfaces to be held) 2 and 2' each are 25 μm or less, in holding the side surfaces of the substrate in the state that the main surface is upright, the local deformation is not generated in the substrate, and this does not affect the measurement of the flatness of the main surface. Therefore, the flatness of the main surface can be measured with very high precision with an error within ±10 nm.

Flatnesses of the side surfaces (surfaces to be held) 2 and 2' each are preferably 10 μm or less and more preferably 5 μm or less.

On the other hand, flatnesses of side surfaces that are not used as surfaces to be held (side surfaces 3 and 3' in the case that the surfaces to be held are 2 and 2') among four side surfaces 2, 2', 3 and 3', each are not required to be 25 μm or less, and can be a flatness of the level generally required, for example, each can be 500 μM or less, preferably 100 μm or less, more preferably 60 μm or less, and further preferably 50 μm or less.

However, from the reasons that selection of the surfaces to be held is not limited, the surfaces to be held can be changed, and the like, the side surfaces that are not used as the surfaces to be held preferably have the equivalent flatness as in the surfaces to be held. Therefore, the flatnesses of the side surfaces that are not used as the surfaces to be held, each are more preferably 25 μm or less, further preferably 10 μm or less, and particularly preferably 5 μm or less.

The above description is directed to the case that the surfaces to be held are the side surfaces 2 and 2', but the side surfaces 3 and 3' may be used as the surfaces to be held. In this case, the flatnesses of side surfaces 3 and 3' each are 25 μm or less, preferably 10 μm or less, and more preferably 5 μm or less.

In this case, the flatnesses of side surfaces 2 and 2' that are not used as the surfaces to be held each are not required to be 25 μm or less, and can be flatness of the level generally required, for example, each can be 500 μm or less, preferably 100 μm or less, more preferably 60 μm or less, and further preferably 50 μm or less.

However, the flatnesses of side surfaces that are not used as the surfaces to be held each are more preferably 25 μm or less, further preferably 10 μm or less, and particularly preferably 5 μm or less, as described above.

Further, in order to prevent the substrate 10 from deforming locally when the side surfaces (surfaces to be held) 2 and 2' of the substrate 10 are held by a holder 20 in the state that the main surface 1 is upright, the parallelism of the side surfaces 2 and 2' that serve as the surfaces to be held is preferably 0.01 mm/inch or less, more preferably 0.005 mm/inch or less, further preferably 0.002 mm/inch or less, and particularly preferably 0.001 mm/inch or less.

The term "parallelism of side surfaces" used herein means a degree of deviation from parallel state of the side surfaces 2 and 2' that serve as the surfaces to be held, and is defined by the ratio between the largest difference with respect to the designated length and the designated length when the distance from the representative flat surface of one side surface to the other side surface is measured in at least two directions. For example, when the side surface 2' is placed on a platen and the distance up to the side surface 2 is measured on the basis of the side surface 2', the side surface 2' is called the representative flat surface, and the largest difference of distance in each point, measured in scanning one inch is called "the largest difference with respect to the designated length". The parallelism of the side surfaces can be measured using a contact-type surface roughness and contour shape measuring equipment, for example, SURFCOM 1400D, manufactured by Tokyo Seimitsu Co., Ltd.

In the case that the side surfaces 3 and 3' are the surfaces to be held, the parallelism of the side surfaces 3 and 3' is preferably 0.01 mm/inch or less, more preferably 0.005 mm/inch or less, further preferably 0.002 mm/inch or less, and particularly preferably 0.001 mm/inch or less.

In order to prevent the substrate 10 from deforming locally when the side surfaces (surfaces to be held) 2 and 2' of the substrate 10 are held by a holder 20 in the state that the main surface 1 is upright, the squarenesses of the main surface 1 (or main surface 1') with the side surfaces 2 and 2' that serve as the surfaces to be held, each are preferably 0.01 mm/inch or less, more preferably 0.005 mm/inch or less, and further preferably 0.003 mm/inch or less.

The squareness of the main surface 1 (or main surface 1') with the side surface 2 (or side surface 2') is defined by the value of a parallelism between a line vertical to the representative flat surface of the side surface 2 (or side surface 2') and the main surface 1 (or main surface 1'), and can be measured using a contact-type surface roughness and contour shape measuring equipment, for example, SURFCOM 1400D, manufactured by Tokyo Seimitsu Co., Ltd.

In the case that the side surfaces 3 and 3' are the surfaces to be held, the squarenesses of the main surface 1 (or main surface 1') with the side surfaces 3 and 3' each are preferably 0.01 mm/inch or less, more preferably 0.005 mm/inch or less, and further preferably 0.003 mm/inch or less.

In the second embodiment of the low expansion glass substrate for a reflective mask of the present invention (hereinafter referred to as a "second low expansion glass substrate"), the chamfered portions 4 and 4' formed at the corners between: two side surfaces (side surfaces 2 and 2', or side surfaces 3 and 3') positioned to face each other among four side surfaces 2, 2', 3 and 3'; and the main surfaces 1 and 1' of the low expansion glass substrate 10 (the chamfered portion 4 formed at the corner between the side surface 2' and the main surface 1, and the chamfered portion 4' formed at the corner between the side surface 2' and the main surface 1' are not shown in Figs.), each have a flatness of 25 μm or less.

That "the chamfered portions 4 and 4' each have a flatness of 25 μm or less" means that the flatness in the entire chamfered portion is 25 μm or less in the respective chamfered portions 4 and 4', that is, the difference in height in each entire chamfered portions is 25 μm or less.

The flatness of the chamfered portion can be measured using a flatness measuring equipment, for example, FM200, manufactured by Corning Tropel.

In the second low expansion glass substrate, the reason that the flatnesses of the chamfered portions 4 and 4' formed at the corners between: two side surfaces positioned to face each other; and the main surfaces 1 and 1' of the low expansion glass substrate 10, each are made to be 25 μm or less is the same as the reason that the flatnesses of two side surfaces positioned to face each other each are made to be 25 μm or less in the first low expansion glass substrate.

Even in the case where the sides of the side surfaces 2 and 2' are the surfaces to be held, depending on the shape of a holder, there is a case that the side surfaces 2 and 2' do not come into contact with the holder and the chamfered portions 4 and 4' formed at the corners between the side surfaces 2 and 2' and the main surfaces 1 and 1' come into contact with the holder. In this case, the chamfered portions 4 and 4' serve as the surfaces to be held.

When the flatness of at least one of the chamfered portions 4 and 4' that serve as the surfaces to be held is large, in holding the substrate in the state that the main surface is upright, local deformation is generated in the substrate and affects the measurement of the flatness of the main surface.

When the flatnesses of the chamfered portions 4 and 4' each are 25 μm or less, in holding the side surfaces of the substrate in the state that the main surface is upright, the local deformation is not generated in the substrate, and this does not affect the measurement of the flatness of the main surface. Therefore, the flatness of the main surface can be measured with very high precision with an error within ±10 nm.

The flatnesses of the chamfered portions 4 and 4' each are preferably 10 μm or less and more preferably 5 μm or less.

On the other hand, the flatnesses of chamfered portions that are not used as the surfaces to be held (the chamfered portions formed at the corners between the side surfaces 3 and 3' and the main surfaces 1 and 1' in the case that the surfaces to be held are the chamfered portions 4 and 4' formed at the corners between the side surfaces 2 and 2' and the main surfaces 1 and 1'), each are not required to be 25 μm or less, and can be a flatness of the level generally required, for example, each can be 500 μm or less, preferably 100 μm or less, more preferably 60 μm or less, and further preferably 50 μm or less.

However, from the reasons that selection of the surfaces to be held is not limited, the surfaces to be held can be changed, and the like, the chamfered portions that are not used as the surfaces to be held preferably have the equivalent flatness as in the surfaces to be held. Therefore, the flatnesses of the chamfered portions that are not used as the surfaces to be held, each are more preferably 25 μm or less, further preferably 10 μm or less, and particularly preferably 5 μm or less.

The above description is directed to the case that the surfaces to be held are the chamfered portions formed at the corners between the side surfaces 2 and 2' and the main surfaces 1 and 1', but the chamfered portions formed at the corners between the side surfaces 3 and 3' and the main surfaces 1 and 1' may be used as the surfaces to be held. In this case, the flatnesses of the chamfered portions that serve as the surfaces to be held each are 25 μm or less, preferably 10 μm or less, and more preferably 5 μm or less.

In this case, the flatnesses of the chamfered portions at the sides that are not used as the surfaces to be held (the chamfered portions 4 and 4' formed at the corners between the side surfaces 2 and 2' and the main surfaces 1 and 1') each are not required to be 25 μm or less, and can be a flatness of the level generally required, for example, each can be 500 μm or less, preferably 100 μm or less, more preferably 60 μm or less, and further preferably 50 μm or less.

However, the flatnesses of the chamfered portions that are not used as the surfaces to be held each are more preferably 25 μm or less, further preferably 10 μm or less, and particularly preferably 5 μm or less, as described above.

Even in the second low expansion glass substrate, in order to prevent the substrate 10 from deforming locally when the surfaces to be held (the chamfered portions 4 and 4') of the substrate 10 are held by a holder 20 in the state that the main surface 1 is upright, the parallelism of the side surfaces 2 and 2' is preferably 0.01 mm/inch or less, more preferably 0.005 mm/inch or less, further preferably 0.002 mm/inch or less, and particularly preferably 0.001 mm/inch or less.

For the same reason, the squarenesses of the main surface 1 (or the main surface 1') with the side surfaces 2 and 2' each are preferably 0.01 mm/inch or less, more preferably 0.005 mm/inch or less, and further preferably 0.003 mm/inch or less.

In the case that the chamfered portions formed at the corners between the side surfaces 3 and 3' and the main surfaces 1 and 1' are the surfaces to be held, the parallelism of the side surfaces 3 and 3' is preferably 0.01 mm/inch or less, more preferably 0.005 mm/inch or less, further preferably 0.002 mm/inch or less, and particularly preferably 0.001 mm/inch or less. Furthermore, the squarenesses of the main surface 1 (or the main surface 1') with the side surfaces 3 and 3' each are preferably 0.01 mm/inch or less, more preferably 0.005 mm/inch or less, and further preferably 0.003 mm/inch or less.

In the third embodiment of the low expansion glass substrate for a reflective mask of the present invention (hereinafter referred to as a "third low expansion glass substrate"), two side surfaces (side surfaces 2 and 2') positioned to face each other among four side surfaces 2, 2', 3 and 3', each have a flatness of 25 μm or less, and the chamfered portions 4 and 4' formed at the corners between the side surfaces 2 and 2' and the main surfaces 1 and 1', each have a flatness of 25 μm or less.

In the third low expansion glass substrate, the reason that the flatnesses of the side surfaces 2 and 2' each are made to be 25 μm or less is the same reason as the reason that the flatnesses of the side surfaces 2 and 2' each are made to be 25 μm or less in the first low expansion glass substrate, and the reason that the flatnesses of the chamfered portions 4 and 4' each are made to be 25 μm or less is the same reason as the reason that the flatnesses of the chamfered portions each are made to be 25 μm or less in the second low expansion glass substrate.

In the case where the sides of the side surfaces 2 and 2' are the surface to be held, depending on the shape of a holder, there is a case that both of; the side surfaces 2 and 2'; and the chamfered portions 4 and 4' formed at the corners between the side surfaces 2 and 2' and the main surfaces 1 and 1', come into contact with the holder. In this case, the side surfaces 2 and 2', and the chamfered portions 4 and 4' serve as the surfaces to be held.

In this case, when the flatness of at least one of the side surfaces 2 and 2' and the chamfered portions 4 and 4' that serve as the surfaces to be held is large, in holding the substrate in the state that the main surface is upright, local deformation is generated in the substrate and affects the measurement of the flatness of the main surface.

When the flatnesses of the side surfaces 2 and 2' and the chamfered portions 4 and 4' each are 25 μm or less, in holding the side surfaces of the substrate in the state that the main surface is upright, the local deformation is not generated in the substrate, and this does not affect the measurement of the flatness of the main surface. Therefore, the flatness of the main surface can be measured with very high precision with an error within ±10 nm.

The flatnesses of the side surfaces 2 and 2' and the chamfered portions 4 and 4' each are preferably 10 μm or less, and more preferably 5 μm or less.

On the other hand, the flatnesses of the side surfaces (side surfaces 3 and 3') and the chamfered portions formed at the corners formed between the side surfaces (the side surfaces 3 and 3') and the main surfaces 1 and 1' that are not used as the surface to be held, each are not required to be 25 µm or less, and can be a flatness of the level generally required, for example, each can be 500 µm or less, preferably 100 µm or less, more preferably 60 µm or less, and further preferably 50 µm or less.

However, the flatnesses of the side surfaces and the chamfered portions that are not used as the surfaces to be held, each are more preferably 25 µm or less, further preferably 10 µm or less, and particularly preferably 5 µm or less, as described above.

The above description is directed to the case that the surfaces to be held are the side surfaces 2 and 2' and the chamfered portions 4 and 4' formed at the corners between the side surfaces 2 and 2' and the main surfaces 1 and 1', but the side surfaces 3 and 3' and the chamfered portions formed at the corners between the side surfaces 3 and 3' and the main surfaces 1 and 1' may be used as the surfaces to be held. In this case, the flatnesses of the side surfaces 3 and 3' and the chamfered portions formed at the corners between the side surfaces 3 and 3' and the main surfaces 1 and 1' that serve as the surfaces to be held, each are 25 µm or less, preferably 10 µm or less, and more preferably 5 µm or less.

In this case, the flatnesses of the side surfaces 2 and 2' and the chamfered portions 4 and 4' formed at the corners between the side surfaces 2 and 2' and the main surfaces 1 and 1' at the sides that are not used as the surface to be held, each is not required to be 25 µm or less, and can be a flatness of the level generally required, for example, each can be 500 µm or less, preferably 100 µm or less, more preferably 60 µm or less, and further preferably 50 µm or less.

However, the flatnesses of the side surfaces and the chamfered portions that are not used as the surfaces to be held, each is more preferably 25 µm or less, further preferably 10 µm or less, and particularly preferably 5 µm or less, as described above.

Even in the third low expansion glass substrate, in order to prevent the substrate 10 from deforming locally when the surfaces to be held (the side surfaces 2 and 2' and/or the chamfered portions 4 and 4') of the substrate 10 are held by a holder 20 in the state that the main surface 1 is upright, the parallelism of the side surfaces 2 and 2' is preferably 0.01 mm/inch or less, more preferably 0.005 mm/inch or less, further preferably 0.002 mm/inch or less, and particularly preferably 0.001 mm/inch or less.

For the same reason, the squarenesses of the main surface 1 (or the main surface 1') with the side surfaces 2 and 2' each are preferably 0.01 mm/inch or less, more preferably 0.005 mm/inch or less, and further preferably 0.003 mm/inch or less.

In the case that the side surfaces 3 and 3' and the chamfered portions formed at the corners between the side surfaces 3 and 3' and the main surfaces 1 and 1' are the surfaces to be held, the parallelism of the side surfaces 3 and 3' is preferably 0.01 mm/inch or less, more preferably 0.005 mm/inch or less, further preferably 0.002 mm/inch or less, and particularly preferably 0.001 mm/inch or less. Furthermore, the squarenesses of the main surface 1 (or the main surface 1') with the side surfaces 3 and 3' each are preferably 0.01 mm/inch or less, more preferably 0.005 mm/inch or less, and further preferably 0.003 mm/inch or less.

The first to third low expansion glass substrates described above can be obtained by cutting a glass out of a low expansion glass or an ultra-low expansion glass into a desired size and shape, subjecting the glass to chamfering, thereby obtaining a plate-shaped product having a chamfered portion(s) and a notched portion(s) formed thereon, and then subjecting the product to precision polishing such that the flatness of the side surfaces and/or the chamfered portions that serve as the surfaces to be held each are 25 µm or less. The precision polishing method includes a method of polishing the side surfaces and/or chamfered portions that serve as the surfaces to be held, using fixed grindstone having a grain size of #1000 or less, a method of brush polishing using abrasive grains having a particle diameter of from 0.1 to 3 µm, and preferably from 0.5 to 2 µm, and a method of polishing processing using a sponge-like tool.

Regarding the parallelism of the side surfaces at the side that serve as the surfaces to be held, and/or the squarenesses of the main surfaces of the substrate with the side surfaces at the side that serve as the surfaces to be held, the precision polishing can be conducted using the above precision polishing methods such that the parallelism of the side surfaces is 0.01 mm/inch or less, and/or the squarenesses of the main surfaces with the side surfaces each are 0.01 mm/inch or less.

The first low expansion glass substrate of which the side surfaces that serve as the surfaces to be held each have a flatness of 25 µm or less can be obtained by measuring the flatness of the side surfaces that serve as the surfaces to be held, for the glass substrate after pre-polishing, using a flatness measuring equipment, for example, FM200, manufactured by Corning Tropel, and setting the processing conditions of the side surfaces in site by site based on the flatnesses of the side surfaces obtained.

The "pre-polishing" used herein includes the polishing with a metal or a resin, impregnated with abrasive grains.

The measurement result of the flatness of the side surface of the glass substrate gives a flatness map showing difference in height in each site of the side surface having a two-dimensional shape (hereinafter simply referred to as a "flatness map"). When the coordinates of side surface having a two-dimensional shape are (x, y), the flatness map is expressed by S(x, y) (µm). The processing time is expressed by T(x, y) (min). When the processing rate is taken as Y (µm/min), those relationships are represented by the following formula.

$$T(x,y)=S(x,y)/Y$$

Therefore, in the case of setting the processing conditions based on the results obtained from the measurement of the flatnesses of the side surfaces, the processing conditions, specifically the processing time, are set according the above formula.

As the processing method, the above-described precision polishing methods are preferably used.

A number of rots are generally produced as low expansion glass substrates for a reflective mask used in the lithography step of semiconductor production steps. Therefore, the tendency of the flatnesses of the side surfaces and/or chamfered portions after precision polishing can be known from the measurement of the flatnesses of the side surfaces and/or chamfered portions that serve as the surfaces to be held for the low expansion glass substrate for a reflective mask produced by precision polishing the side surfaces and/or chamfered portions that serve as the surfaces to be held such that the flatnesses thereof each are 25 µm or less.

Furthermore, the tendency of the parallelism of the side surfaces at the side that serve as the surfaces to be held and/or the squarenesses of the main surfaces of the substrate with the side surfaces at the side that serve as the surfaces to be held after precision polishing, can be known from the measurement of the parallelism of the side surfaces at the side that serve as the surfaces to be held and/or the squarenesses of the main surfaces of the substrate with the side surfaces at the side that serve as the surfaces to be held.

In newly producing low expansion glass substrates for a reflective mask, the processing can be conducted such that the flatnesses of the side surfaces and/or chamfered portions that serve as the surfaces to be held each are 25 µm or less by setting the processing conditions of the side surfaces and/or chamfered portions in site by site, based on those tendencies. Similarly, the processing can be conducted such that the parallelism of the side surfaces at the side that serve as the surfaces to be held is 0.01 mm/inch or less, and/or the squarenesses of the main surfaces of the substrate with the side surfaces at the side that serve as the surfaces to be held each are 0.01 mm/inch or less, by setting the processing conditions of the side surfaces in site by site, based on those tendencies.

The procedure of processing the side surfaces and/or chamfered portions by setting the processing conditions of the side surfaces and/or chamfered portions in site by site based on the tendency obtained from the measurement of the low expansion glass substrate for a reflective mask produced previously can be conducted by the similar concept as the procedure of setting the processing conditions of the side surfaces in site by site based on the flatnesses of the side surfaces of the glass substrate after pre-polishing.

DESCRIPTION OF REFERENCE NUMERALS AND SIGNS

1, 1': Main surface
2, 2': Side surface
3, 3': Side surface
4, 4': Chamfered portion
5: Notched portion
6: Chamfered portion
10: Low expansion glass substrate
20: Holder

The invention claimed is:

1. A substrate for a reflective mask in a semiconductor production lithography, comprising:
    a low expansion glass substrate having a plurality of main surfaces and a plurality of side surfaces formed along a periphery of the main surfaces of the low expansion glass substrate, the plurality of side surfaces including two side surfaces positioned to face each other,
    wherein each of the two side surfaces has a flatness which is a difference in height of 25 µm or less.

2. A substrate for a reflective mask in a semiconductor production lithography, comprising:
    a low expansion glass substrate having a plurality of main surfaces and a plurality of side surfaces formed along a periphery of the main surfaces of the low expansion glass substrate, the plurality of side surfaces including two side surfaces positioned to face each other,
    wherein the low expansion glass substrate has a plurality of chamfered portions formed at corners between the two side surfaces and main surfaces of the low expansion glass substrate, and each of the chamfered portions has a flatness which is a difference in height of 25 µm or less.

3. A substrate for a reflective mask in a semiconductor production lithography, comprising:
    a low expansion glass substrate having a plurality of main surfaces and a plurality of side surfaces formed along a periphery of the main surfaces of the low expansion glass substrate, the plurality of side surfaces including two side surfaces positioned to face each other,
    wherein the low expansion glass substrate has a plurality of chamfered portions formed at corners between the two side surfaces and main surfaces of the low expansion glass substrate, and each of the two side surfaces and chamfered portions has a flatness which is a difference in height of 25 µm or less.

4. The substrate for a reflective mask according to claim 1, wherein a parallelism of the two side surfaces is 0.01 mm/inch or less.

5. The substrate for a reflective mask according to claim 1, wherein each of the main surfaces of the low expansion glass substrate has a squareness of 0.01 mm/inch or less.

6. The substrate for a reflective mask according to claim 1, wherein the low expansion glass substrate has a coefficient of thermal expansion at 20° C. or 60° C. of 0±30 ppb/° C.

7. A reflective mask comprising the substrate for a reflective mask according to claim 1.

8. The substrate for a reflective mask according to claim 2, wherein a parallelism of the two side surfaces is 0.01 mm/inch or less.

9. The substrate for a reflective mask according to claim 2, wherein each of the main surfaces of the low expansion glass substrate has a squareness of 0.01 mm/inch or less.

10. The substrate for a reflective mask according to claim 2, wherein the low expansion glass substrate has a coefficient of thermal expansion at 20° C. or 60° C. of 0±30 ppb/° C.

11. A reflective mask comprising the substrate for a reflective mask according to claim 2.

12. The substrate for a reflective mask according to claim 3, wherein a parallelism of the two side surfaces is 0.01 mm/inch or less.

13. The substrate for a reflective mask according to claim 3, wherein each of the main surfaces of the low expansion glass substrate has a squareness of 0.01 mm/inch or less.

14. The substrate for a reflective mask according to claim 3, wherein the low expansion glass substrate has a coefficient of thermal expansion at 20° C. or 60° C. of 0±30 ppb/° C.

15. A reflective mask comprising the substrate for a reflective mask according to claim 3.

16. A method for processing a low expansion glass substrate for a reflective mask in a semiconductor production lithography, the method comprising:
    providing a low expansion glass substrate having a plurality of main surfaces and a plurality of side surfaces formed along a periphery of the main surfaces of the low expansion glass substrate, the plurality of side surfaces including two side surfaces positioned to face each other;
    measuring after pre-polishing a difference in height as a flatness of each of the two side surfaces; and
    setting processing conditions of the two side surfaces in site by site based on the flatness of each of the two side surfaces.

17. The method for processing a low expansion glass substrate according to claim 16, further comprising processing the two side surfaces such that each of the two side surfaces has a flatness which is a difference in height of 25 µm or less.

18. The method for processing a low expansion glass substrate according to claim 16, further comprising processing a plurality of chamfered portions of the low expansion glass substrate such that each of the chamfered portions has a flatness which is a difference in height of 25 µm or less, wherein the providing of the low expansion glass substrate comprises providing the low expansion glass substrate having the chamfered portions formed at corners between the two side surfaces and main surfaces of the low expansion glass substrate.

19. The method for processing a low expansion glass substrate according to claim 16, further comprising processing the two side surfaces and a plurality of chamfered portions of the low expansion glass substrate such that each of the two side surfaces and chamfered portions has a flatness which is a difference in height of 25 μm or less, wherein the providing of the low expansion glass substrate comprises providing the low expansion glass substrate having the chamfered portions formed at corners between the two side surfaces and main surfaces of the low expansion glass substrate.

20. The method for processing a low expansion glass substrate according to claim 16, wherein a parallelism of the two side surfaces is 0.01 mm/inch or less.

* * * * *